(12) United States Patent
Ishida

(10) Patent No.: US 9,934,860 B1
(45) Date of Patent: Apr. 3, 2018

(54) SEMICONDUCTOR MEMORY DEVICE AND METHOD FOR DRIVING SAME

(71) Applicant: TOSHIBA MEMORY CORPORATION, Minato-ku (JP)

(72) Inventor: Takashi Ishida, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/453,058

(22) Filed: Mar. 8, 2017

Related U.S. Application Data

(60) Provisional application No. 62/401,220, filed on Sep. 29, 2016.

(51) Int. Cl.
*G11C 16/06* (2006.01)
*G11C 16/16* (2006.01)
(Continued)

(52) U.S. Cl.
CPC .......... *G11C 16/16* (2013.01); *G11C 16/0466* (2013.01); *H01L 23/528* (2013.01);
(Continued)

(58) Field of Classification Search
CPC . G11C 16/0483; G11C 16/10; G11C 11/5628; G11C 16/26; G11C 16/3454; G11C 16/3445; G11C 16/3459; G11C 2211/5621; G11C 11/5621; G11C 11/5635; G11C 16/0408; G11C 11/4097; G11C 16/04

USPC ........... 365/185.18, 185.17, 185.11, 185.22, 365/185.03, 154, 185.12, 185.2, 185.21, 365/185.3, 203, 230.03, 184, 185.08, 365/185.28
See application file for complete search history.

(56) References Cited

U.S. PATENT DOCUMENTS 8,902,657 B2   12/2014   Iwai et al.
8,988,937 B2    3/2015   Dunga et al.
(Continued)

FOREIGN PATENT DOCUMENTS

JP   2012-69205   4/2012
JP   2013-93577   5/2013
(Continued)

*Primary Examiner* — Thong Q Le
(74) *Attorney, Agent, or Firm* — Oblon, McClelland, Maier & Neustadt, L.L.P.

(57) ABSTRACT

A semiconductor memory device includes first to fourth electrodes; first and second semiconductor members; a first charge storage member provided between the first semiconductor member and the first electrode; a first interconnect connected to the second electrode side of the first semiconductor member and to the fourth electrode side of the second semiconductor member; and a control circuit. The control circuit sets the first interconnect to a floating state, causes a potential of the third electrode side of the second semiconductor member to increase to a first potential, causes the potential of the third electrode to increase to a second potential lower than the first potential, causes the potential of the second electrode to increase to a third potential lower than the first potential, applies a fourth potential lower than the second and the third potentials to the first electrode, and sets the fourth electrode to a floating state.

19 Claims, 9 Drawing Sheets

(51) Int. Cl.
*H01L 27/1157* (2017.01)
*H01L 27/11582* (2017.01)
*H01L 27/11573* (2017.01)
*H01L 23/528* (2006.01)
*H01L 23/522* (2006.01)
*G11C 16/04* (2006.01)

(52) U.S. Cl.
CPC ...... *H01L 23/5226* (2013.01); *H01L 27/1157* (2013.01); *H01L 27/11573* (2013.01); *H01L 27/11582* (2013.01)

(56) References Cited

U.S. PATENT DOCUMENTS

| | | | |
|---|---|---|---|
| 9,117,700 B2 | 8/2015 | Oh et al. | |
| 2015/0029791 A1 | 1/2015 | Itagaki et al. | |
| 2015/0221667 A1 | 8/2015 | Fukuzumi et al. | |
| 2016/0307638 A1* | 10/2016 | Shirakawa | G11C 16/3459 |

FOREIGN PATENT DOCUMENTS

| | | |
|---|---|---|
| JP | 2014-53061 | 3/2014 |
| JP | 2015-149413 | 8/2015 |

* cited by examiner

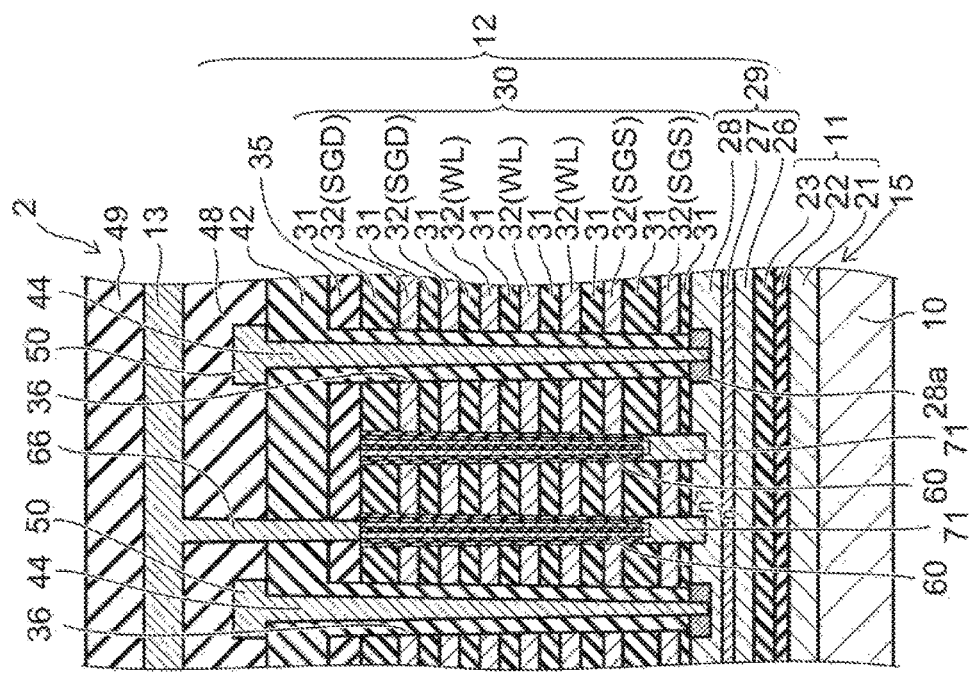
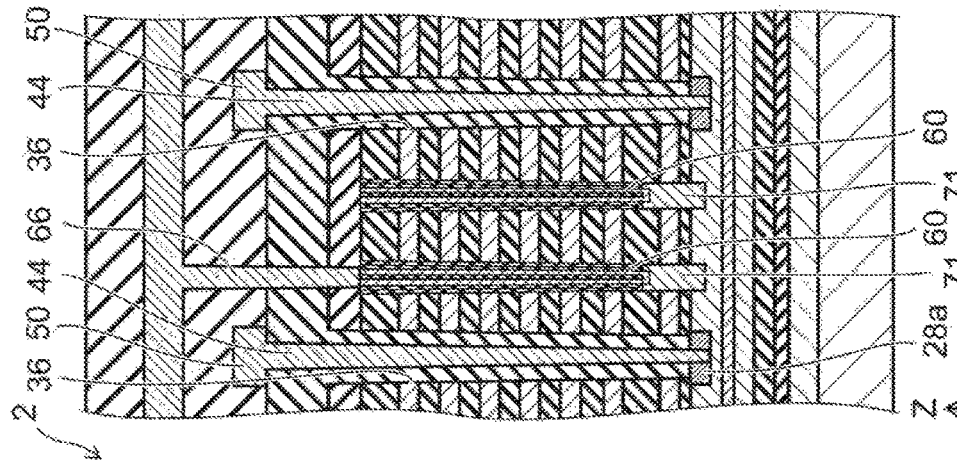
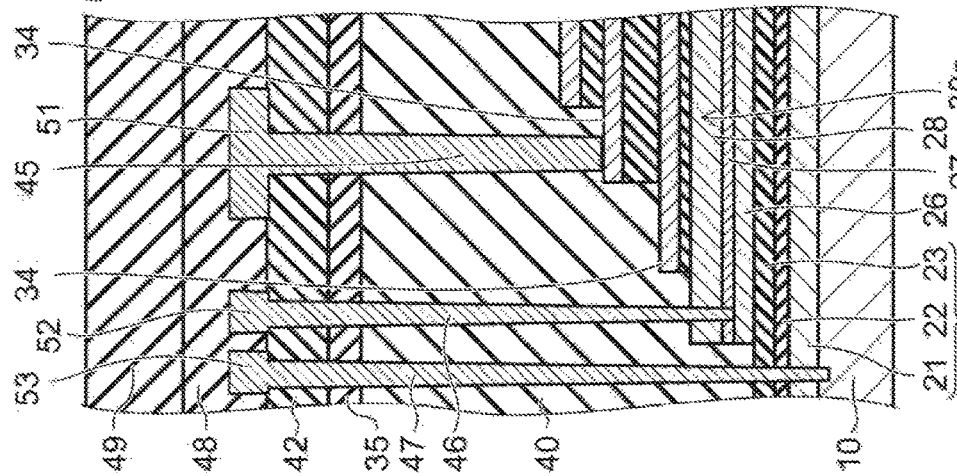
FIG. 7A  FIG. 7B

US 9,934,860 B1

SEMICONDUCTOR MEMORY DEVICE AND METHOD FOR DRIVING SAME

CROSS-REFERENCE TO RELATED APPLICATION

This application is based upon and claims the benefit of priority from U.S. Provisional Patent Application 62/401,220, filed on Sep. 29, 2016; the entire contents of which are incorporated herein by reference.

FIELD

Embodiments described herein relate generally to a semiconductor memory device and method driving same.

BACKGROUND

A stacked semiconductor memory device has been proposed in which memory cells are integrated three-dimensionally. In such a stacked semiconductor memory device, a stacked body in which electrode films and insulating films are stacked alternately is provided on a semiconductor substrate; and semiconductor pillars that pierce the stacked body are provided. Also, a memory cell is formed at each crossing portion between the electrode films and the semiconductor pillars. The lower ends of the semiconductor pillars are connected to the semiconductor substrate; and a current is caused to flow between the semiconductor substrate and the semiconductor pillars. Also, a control circuit for controlling the memory cells is provided at the periphery of the stacked body.

However, in recent years, in such a stacked semiconductor memory device as well, it has been proposed to dispose a portion of the control circuit between the semiconductor substrate and the stacked body to realize even higher integration. In such a case, because the semiconductor substrate can no longer be utilized as an interconnect connected to the semiconductor pillars, some contrivance for the configuration and/or method for driving the device becomes necessary.

BRIEF DESCRIPTION OF THE DRAWINGS

FIG. 7A and FIG. 7B are mutually-orthogonal cross-sectional views showing the semiconductor memory device according to the embodiment;

DETAILED DESCRIPTION

According to one embodiment, a semiconductor memory device includes: a first electrode; a second electrode; a third electrode; a fourth electrode; a first semiconductor member including a first portion and a second portion, the first portion being affected by a potential of the first electrode, the second portion being affected by a potential of the second electrode; a second semiconductor member including a third portion and a fourth portion, the third portion being affected by a potential of the third electrode, the fourth portion being affected by a potential of the fourth electrode; a first charge storage member provided between the first semiconductor member and the first electrode; a first interconnect connected to a first end on the second electrode side of the first semiconductor member and to a first end on the fourth electrode side of the second semiconductor member; and a control circuit, the control circuit in a first operation setting the first interconnect to a floating state, causing a potential of a second end on the third electrode side of the second semiconductor member to increase to a first potential, causing the potential of the third electrode to increase to a second potential by following the first potential, causing the potential of the second electrode to increase to a third potential by following the first potential, applying a fourth potential to the first electrode, and setting the fourth electrode to a floating state or causing the potential of the fourth electrode to increase to a fifth potential, the second potential being lower than the first potential, the third potential being lower than the first potential, the fourth potential being lower than the second potential and the third potential, the fifth potential being higher than the fourth potential but not more than the second potential.

First Embodiment

Embodiments of the invention will now be described with reference to the drawings.

First, a first embodiment will be described.

A semiconductor memory device according to the embodiment is stacked NAND flash memory.

Figure 1:
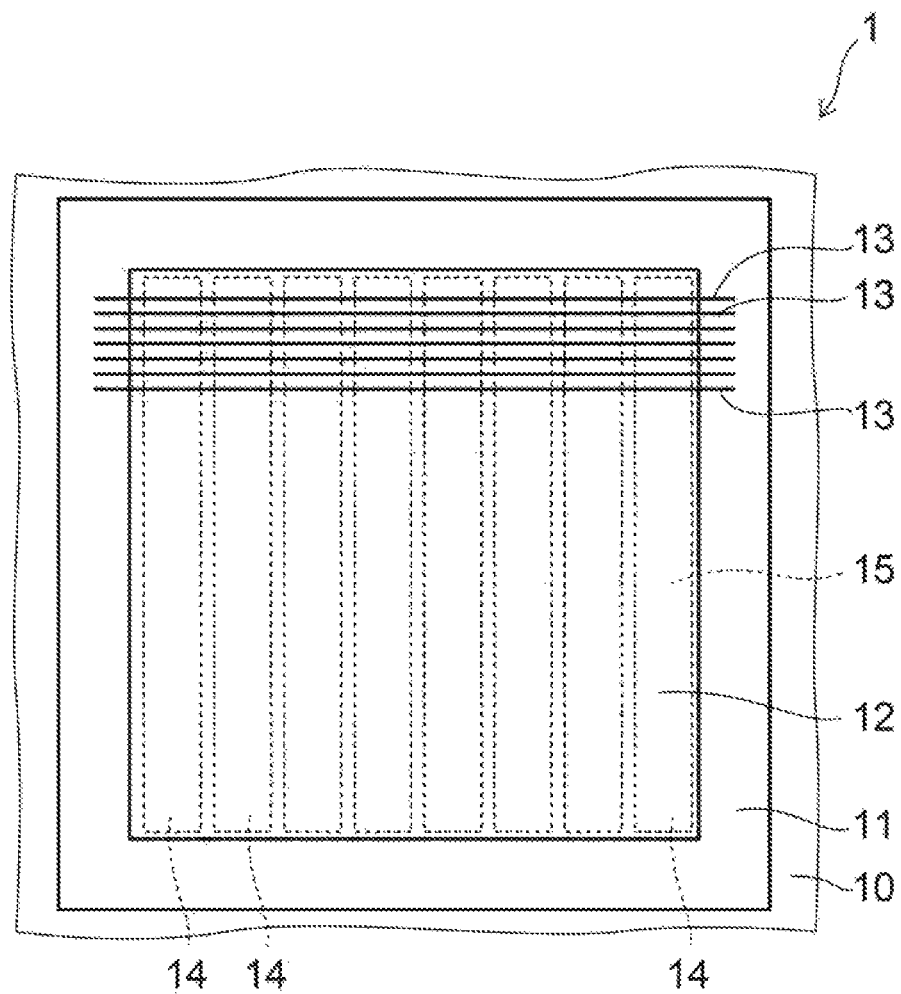
FIG. 1 is a plan view showing a semiconductor memory device according to an embodiment.

FIG. 1 is a plan view showing the semiconductor memory device according to the embodiment.

Figure 2:
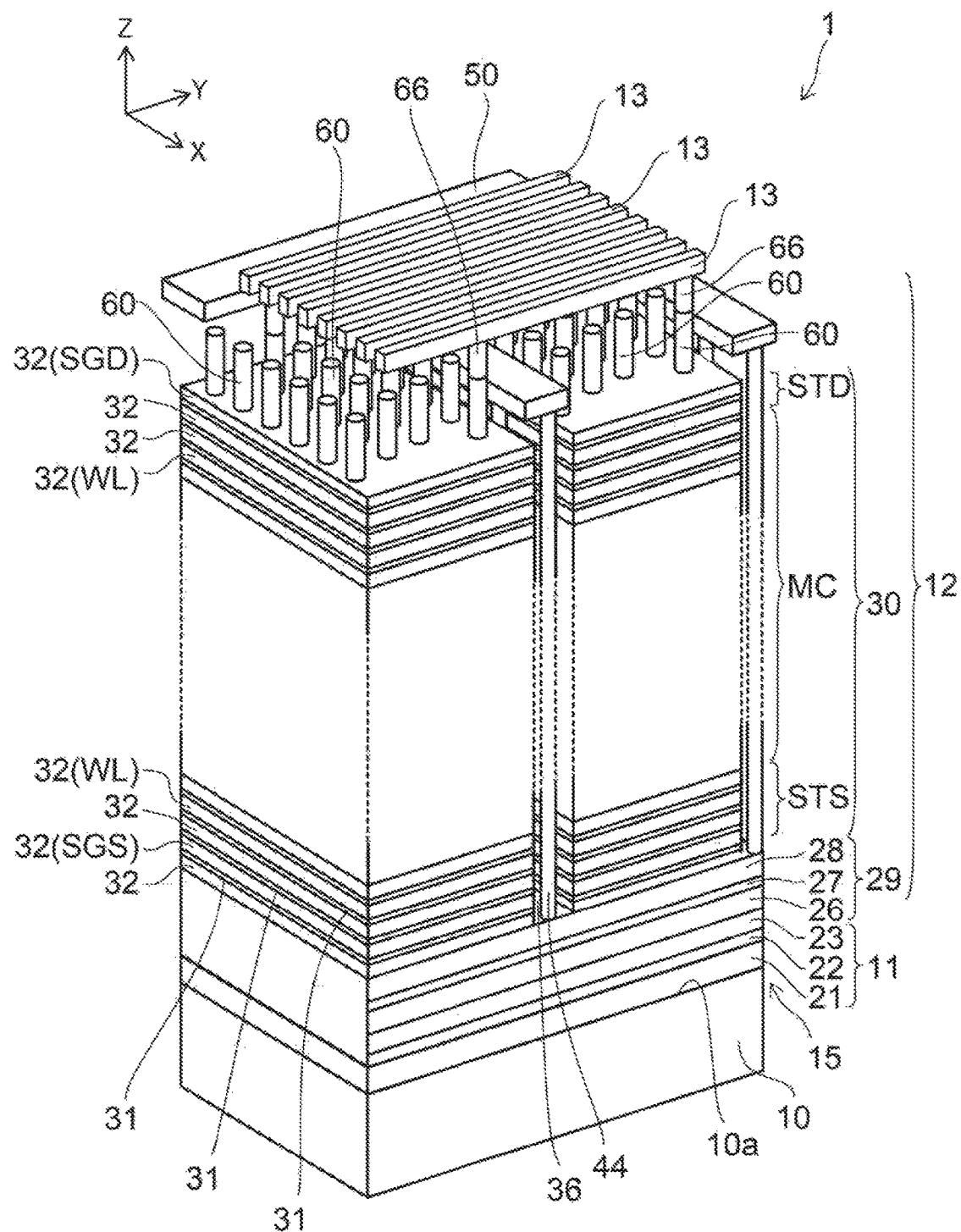
FIG. 2 is a perspective view showing the semiconductor memory device according to the embodiment.

FIG. 2 is a perspective view showing the semiconductor memory device according to the embodiment.

Figures 3A, 3B:
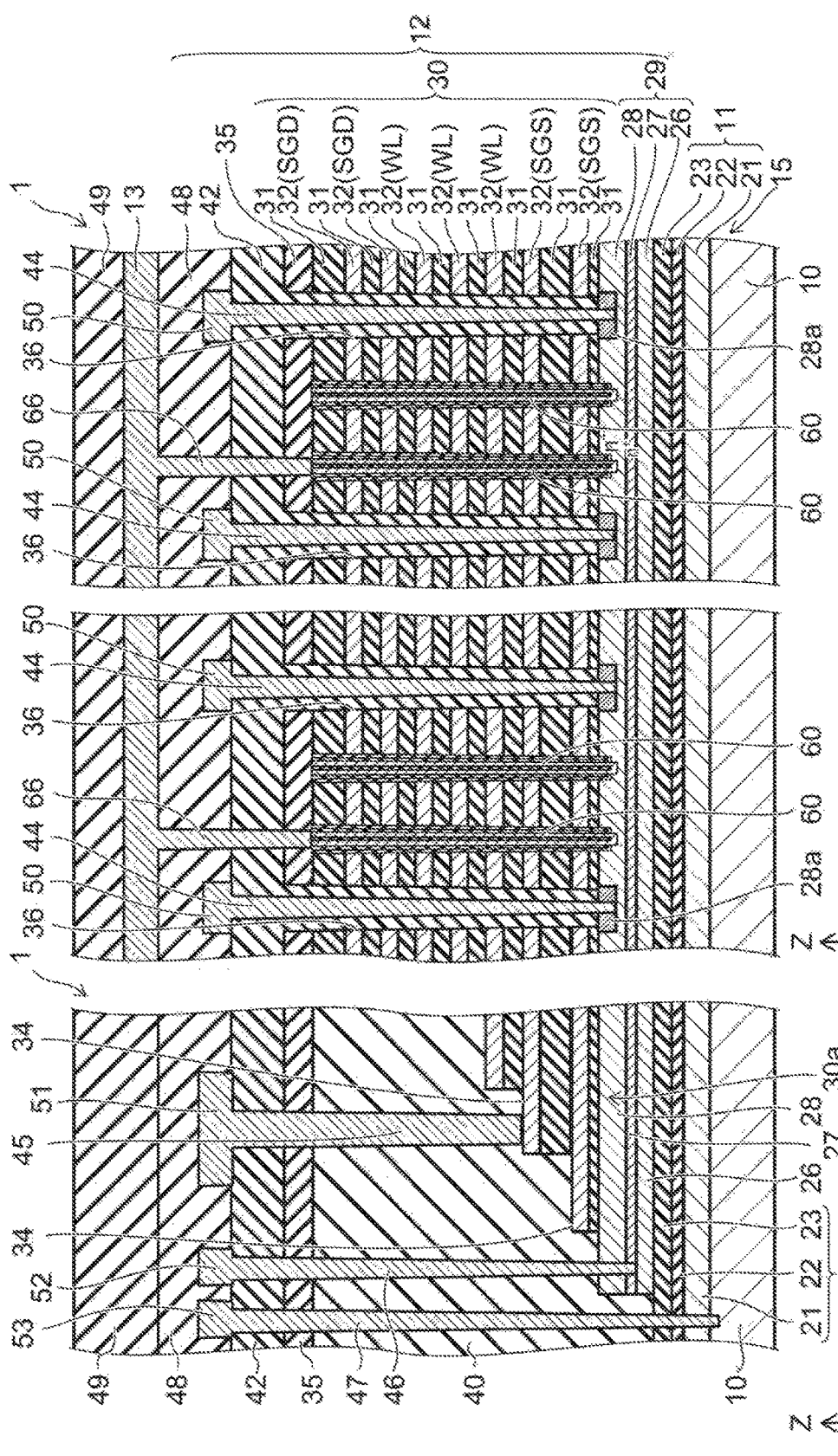
FIG. 3A and FIG. 3B are mutually-orthogonal cross-sectional views showing the semiconductor memory device according to the embodiment.

FIG. 3A and FIG. 3B are mutually-orthogonal cross-sectional views showing the semiconductor memory device according to the embodiment.

Figure 4:
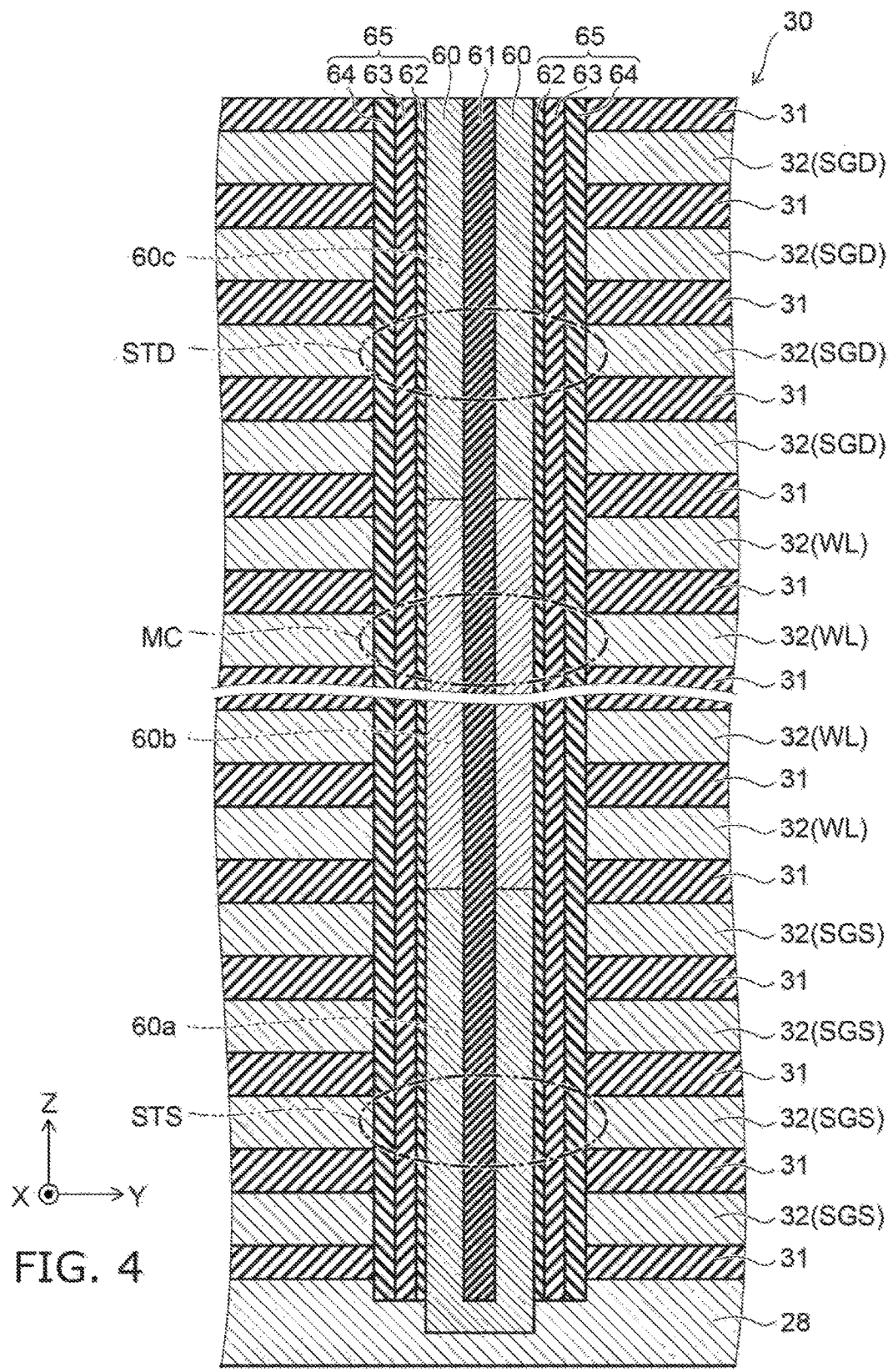
FIG. 4 is a cross-sectional view showing one silicon pillar periphery of the embodiment.

FIG. 4 is a cross-sectional view showing one silicon pillar periphery of the embodiment.

The drawings are schematic and are drawn with appropriate exaggerations or omissions for easier viewing of the drawings. For example, in some of the drawings, the components are drawn to be larger and fewer than the actual components. Also, the number and vertical:horizontal ratios of the components do not always match between drawings. This is similar for the other drawings described below as well.

As shown in FIG. 1 and FIG. 2, a silicon substrate 10 is provided in the semiconductor memory device 1 according to the embodiment. For example, the silicon substrate 10 is formed of a monocrystal of silicon. A circuit layer 11 is provided on the silicon substrate 10. A memory array layer 12 is provided in a portion on the circuit layer 11. A control circuit 15 is formed inside the circuit layer 11 and the upper layer portion of the silicon substrate 10. In other words, at least a portion of the control circuit 15 is disposed between the silicon substrate 10 and the memory array layer 12. Multiple bit lines 13 are provided on the memory array layer 12. The memory array layer 12 is subdivided into multiple blocks 14 along the direction in which the bit lines 13 extend.

An XYZ orthogonal coordinate system is employed for convenience of description in the specification. The direction in which the bit lines 13 extend that is parallel to an upper surface 10a of the silicon substrate 10 is taken as a "Y-direction;" and a direction orthogonal to the Y-direction is taken as an "X-direction." Also, a direction perpendicular to the upper surface 10a of the silicon substrate 10 is taken as a "Z-direction." Although a direction that is in the Z-direction from the silicon substrate 10 toward the bit lines 13 also is called "up" and the reverse direction also is called "down," these expressions are for convenience and are independent of the direction of gravity. Also, the "direction in which the bit lines 13 extend" means the longitudinal direction of the bit lines 13. In other words, for the bit lines 13, the length in the Y-direction is longer than the length in the X-direction and the length in the Z-direction. This is similar for the other components as well.

In the circuit layer 11 as shown in FIG. 2, FIG. 3A, and FIG. 3B, a silicon layer 21, a silicon oxide layer 22, and a silicon oxide film 23 are provided in this order on the silicon substrate 10. The silicon layer 21 is, for example, an n-well or a p-well. The control circuit 15 is configured by providing active elements (not illustrated) such as transistors, etc., inside the circuit layer 11 and the upper layer portion of the silicon substrate 10.

In the specification, "silicon layer" refers to a layer having silicon (Si) as a major component. Also, "silicon oxide film" refers to a film having silicon oxide (SiO) as a major component and contains silicon (Si) and oxygen (O). This is similar for the other materials as well; and in the case where the material name is included in the name of some member, the material is a major component of the member. Also, because silicon oxide normally is an insulating material, a silicon oxide film is an insulating film unless otherwise indicated. This is similar for the other members as well; and as a general rule, the characteristics of the member reflect the characteristics of the major component. However, silicon may be a semiconductor material or a conductive material according to the impurity concentration of the silicon.

In the memory array layer 12, a metal film 26 is provided on the silicon oxide film 23. The metal film 26 is, for example, a multilayer film in which a tungsten nitride layer (WN), a tungsten layer (W), a titanium layer (Ti), and a titanium nitride layer (TIN) are stacked in this order from the lower layer toward the upper layer. An $n^+$-type silicon layer 27 is provided on the metal film 26; and an $n^-$-type silicon layer 28 is provided on the $n^+$-type silicon layer 27. A source line 29 is formed of the metal film 26, the $n^+$-type silicon layer 27, and the $n^-$-type silicon layer 28. The notations of the "$n^+$-type," the "n-type," and the "$n^-$-type" indicate the conductivity types and relative concentrations of the carriers of the components. In other words, each of the three notations indicates that the conductivity type is the n-type; and among the three notations, the carrier concentration of the "$n^+$-type" is the highest, and the carrier concentration of the "$n^-$-type" is the lowest.

A stacked body 30 is provided on the $n^-$-type silicon layer 28. In the stacked body 30, insulating films 31 and electrode films 32 are stacked alternately along the Z-direction. The lowermost layer and the uppermost layer of the stacked body 30 are the insulating films 31. For example, the insulating films 31 are formed of silicon oxide. For example, the electrode films 32 are formed of tungsten. Among the electrode films 32, one or multiple, e.g., four, electrode films 32 from the bottom function as source-side selection gates SGS. Among the electrode films 32, one or multiple, e.g., four, electrode films 32 from the top function as drain-side selection gates SGD. The other electrode films 32 function as word lines WL. A portion of the control circuit 15 or the entire control circuit 15 that is formed inside the silicon substrate 10 and inside the circuit layer 11 is disposed between the silicon substrate 10 and the stacked body 30.

The configuration of an end portion 30a in the X-direction of the stacked body 30 is a staircase configuration; and a terrace 34 is formed every electrode film 32. Also, for example, an inter-layer insulating film 40 that is made of silicon oxide is provided around the $n^-$-type silicon layer 28 and around the stacked body 30 on the circuit layer 11. The inter-layer insulating film 40 covers the end portion 30a of the stacked body 30.

A capping film 35 that is insulative is provided on the stacked body 30 and on the inter-layer insulating film 40. Multiple slits 36 that extend in the X-direction are formed in the stacked body 30 and the capping film 35. The slits 36 are arranged periodically along the Y-direction and divide the stacked body 30 and the capping film 35 in the Y-direction. Therefore, the configuration of each portion of the subdivided electrode films 32 is a band configuration extending in the X-direction.

An insulating film 42 is provided on the capping film 35. The insulating film 42 is provided also inside the slits 36. An impurity diffusion region 28a that is doped with an impurity is formed in the regions of the $n^-$-type silicon layer 28 directly under the slits 36.

A contact 44 that extends in the Z-direction is provided inside the slit 36 and in the region directly above the slit 36 inside the insulating film 42. The lower end of the contact 44 is connected to the impurity diffusion region 28a of the $n^-$-type silicon layer 28. The contact 44 may not be provided inside all of the slits 36. For example, in the case where the electrical resistance of the source line 29 is sufficiently low, the contact 44 may be provided only inside one slit 36 every several slits 36. In other words, the arrangement period of the contacts 44 in the Y-direction may be adjusted according to the resistance of the source line 29. Contacts 45 that extend in the Z-direction are provided inside the inter-layer insulating film 40, the capping film 35, and the insulating film 42 in a region directly above the end portion 30a of the stacked body 30. The lower ends of the contacts 45 are connected to the electrode films 32 at the terraces 34. Also, contacts 46 and 47 are provided at the side of the stacked body 30. The contact 46 pierces the insulating film 42, the capping film 35, the inter-layer insulating film 40, the $n^-$-type silicon layer 28, and the $n^+$-type silicon layer 27; and the lower end of the contact 46 is connected to the metal film 26. The contact 47 pierces the insulating film 42, the capping film 35, the inter-layer insulating film 40, the silicon oxide film 23, the silicon oxide layer 22, and the silicon layer 21; and the lower end of the contact 47 is connected to the silicon substrate 10.

Interconnects 50, 51, 52, and 53 are provided on the insulating film 42. The interconnect 50 is connected to the upper end of the contact 44; the interconnects 51 are connected to the upper ends of the contacts 45; the interconnect 52 is connected to the upper end of the contact 46; and the interconnect 53 is connected to the upper end of the contact 47. Also, an insulating film 48 is provided on the insulating film 42 to cover the interconnects 50, 51, 52, and 53. The configuration from the metal film 26 to the insulating film 48 is taken as the memory array layer 12.

The multiple bit lines 13 that extend in the Y-direction are provided to be parallel to each other on the insulating film 48, that is, on the memory array layer 12 (referring to FIG. 1 and FIG. 2). Also, an insulating film 49 is provided on the insulating film 48 to cover the bit lines 13.

Also, a silicon pillar 60 that extends in the Z-direction is provided inside the stacked body 30. The lower end of the silicon pillar 60 is positioned inside the n$^-$-type silicon layer 28 and is connected directly to the n$^-$-type silicon layer 28. The silicon pillar 60 pierces the multiple electrode films 32 arranged along the Z-direction. The conductivity of the portions of the silicon pillar 60 piercing the electrode films 32 change by being affected by the potentials of the electrode films 32. Thereby, as described below, a transistor that is used as a memory cell MC is formed at each crossing portion between the silicon pillar 60 and the electrode films 32. Also, a plug 66 that extends in the Z-direction is provided inside the capping film 35, the insulating film 42, and the insulating film 48; and the upper end of the silicon pillar 60 is connected directly to the bit line 13 via the plug 66. For example, the silicon pillars 60 are arranged in a staggered configuration having four columns along the X-direction in the portion of the stacked body 30 interposed between two slits 36.

A "direct connection" means a connection that is not via a switching element such as a transistor, a diode, etc., and includes not only the case of being in contact but also a connection that is via a conductive member such as a conductive film, an interconnect, a plug, etc.

As described above, the memory array layer 12 is subdivided into the multiple blocks 14 along the Y-direction. The silicon pillars 60 that belong to different multiple blocks 14 are connected directly to the same source line 29. On the other hand, the silicon pillars 60 that belong to different blocks 14 pierce different electrode films 32. Also, because the bit lines 13 are arranged to cross multiple blocks 14, there are silicon pillars 60 that are connected to a common bit line 13 even for the silicon pillars 60 belonging to different blocks 14. Also, the silicon pillars 60 that belong to the same block 14 are connected to different bit lines 13.

As shown in FIG. 4, the configuration of the silicon pillar 60 is, for example, a circular tube having a plugged lower end. A core member 61 that is made of, for example, silicon oxide is provided inside the silicon pillar 60. The core member 61 may not be provided.

The silicon pillar 60 includes an impurity that forms donors; and the donor concentration changes along the Z-direction. Specifically, the donor concentration is relatively high at a lower portion 60a and an upper portion 60c of the silicon pillar 60, and is relatively low at a central portion 60b interposed between the lower portion 60a and the upper portion 60c. The lower portion 60a is, for example, a portion surrounded with the source-side selection gates SGS; the central portion 60b is, for example, a portion surrounded with the word lines WL; and the upper portion 60c is, for example, a portion surrounded with the drain-side selection gates SGD. However, the change of the donor concentration may be continuous; and the interface between the lower portion 60a and the central portion 60b and the interface between the central portion 60b and the upper portion 60c are not always distinct. The conductivity types of the lower portion 60a and the upper portion 60c are the n-type; and the conductivity type of the central portion 60b is the i-type, the n$^-$-type, or the p$^-$-type.

The donor that is included in the lower portion 60a of the silicon pillar 60 is a donor that has diffused from the n$^+$-type silicon layer 27 and the n$^-$-type silicon layer 28. On the other hand, the donor that is included in the upper portion 60c is a donor that is ion-implanted from above in a manufacturing process of the semiconductor memory device 1. Also, the donor that is included in the central portion 60b has diffused from the lower portion 60a and the upper portion 60c.

A tunneling insulating film 62, a charge storage film 63, and a blocking insulating film 64 are provided on the outer side surface of the silicon pillar 60. Although the tunneling insulating film 62 normally is insulative, the tunneling insulating film 62 is a film in which a tunneling current flows when a prescribed voltage within the range of the drive voltage of the semiconductor memory device 1 is applied and is, for example, a single-layer silicon oxide film or an ONO film in which a silicon oxide layer, a silicon nitride layer, and a silicon oxide layer are stacked in this order. The charge storage film 63 is a film that can store charge and is made of, for example, a material having trap sites, e.g., silicon nitride. The blocking insulating film 64 is a film in which a current substantially does not flow even when a voltage within the range of the drive voltage of the semiconductor memory device 1 is applied and is, for example, a stacked film made of a silicon oxide layer and an aluminum oxide layer. A memory film 65 includes the tunneling insulating film 62, the charge storage film 63, and the blocking insulating film 64. The memory film 65 is disposed between the silicon pillar 60 and the electrode films 32.

Also, in the semiconductor memory device 1, the memory cell MC that includes the memory film 65 is formed at each crossing portion between the silicon pillars 60 and the word lines WL. On the other hand, a source-side selection transistor STS is formed at each crossing portion between the source-side selection gates SGS and the silicon pillars 60. A drain-side selection transistor STD is formed at each crossing portion between the drain-side selection gates SGD and the silicon pillars 60.

Operations of the semiconductor memory device according to the embodiment will now be described.

In the semiconductor memory device 1 according to the embodiment, the control circuit 15 performs the programming, reading, and erasing of data to and from the memory cells MC by controlling the potentials of the source line 29, the source-side selection gates SGS, the word lines WL, the drain-side selection gates SGD, and the bit lines 13 and by measuring the amount of current that flows.

The case will now be described where the data is erased from the memory cells MC belonging to one block 14.

Figure 5:
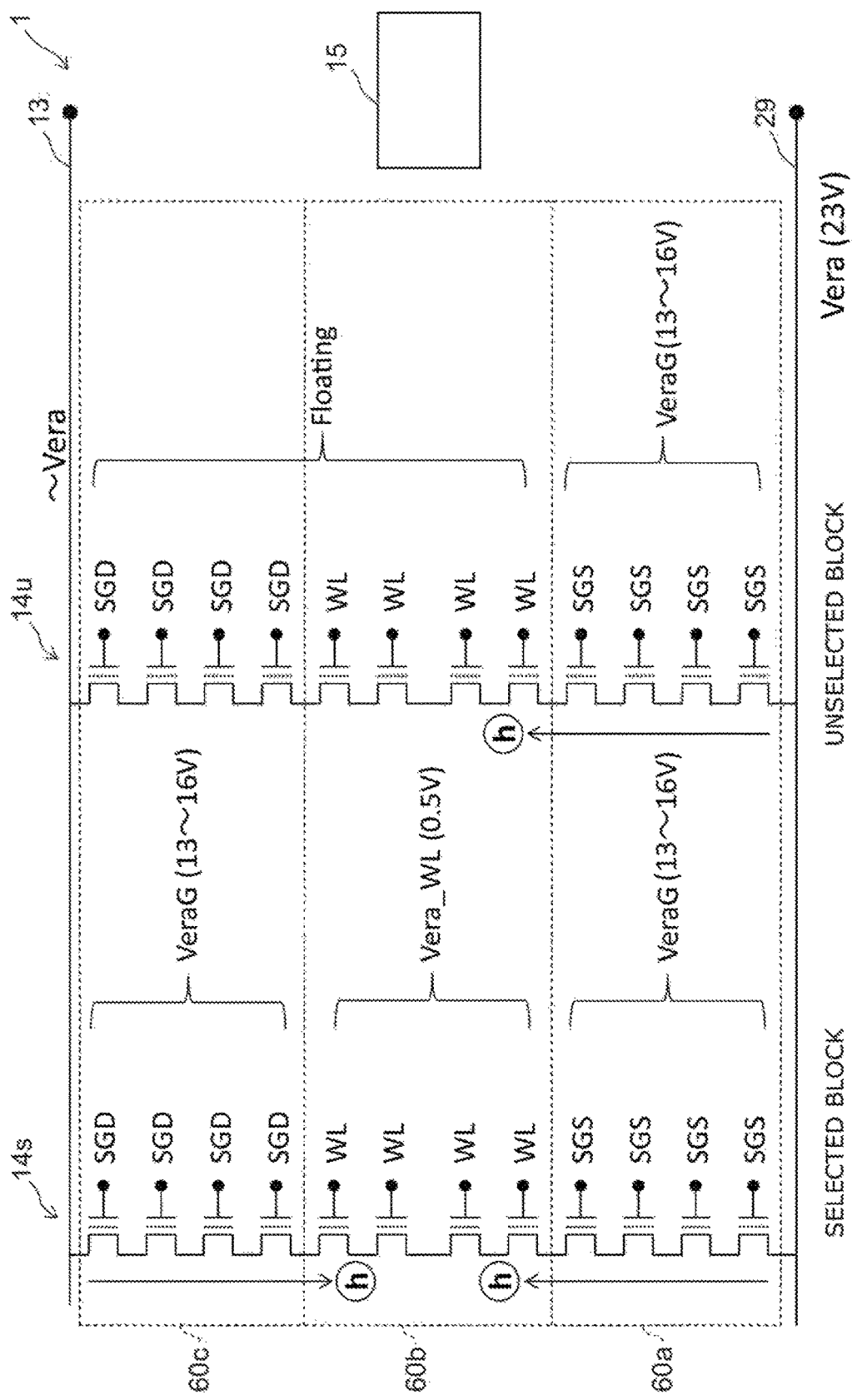
FIG. 5 is a circuit diagram showing a method for erasing the data of the semiconductor memory device according to the embodiment.

FIG. 5 is a circuit diagram showing the method for erasing the data of the semiconductor memory device according to the embodiment.

In the following description, the block 14 that is selected to be erased is called a "selected block 14s;" and the block 14 that is not selected to be erased is called an "unselected block 14u." Also, the silicon pillar 60 of the selected block 14s is called a "selected pillar 60s;" and the silicon pillar 60 of the unselected block 14u is called an "unselected pillar 60u." The lower ends of the selected pillar 60s and the unselected pillar 60u are connected to the same source line 29; and the upper ends that are arranged along the Y-direction are connected to the same bit line 13 (referring to FIG. 2). In the initial state prior to the data erasure, electrons are injected into the charge storage film 63 of the selected block 14s (referring to FIG. 4). Also, the potentials of the source line 29, the electrode films 32, and the bit line 13 are the ground potential, i.e., 0 V (volts).

Then, in the erase operation of the memory cells MC belonging to the selected block 14s, the control circuit 15 sets the bit line 13 to the floating state. In this state, the control circuit 15 causes the potential of the source line 29 to increase from the ground potential to an erasing potential Vera. The erasing potential Vera is, for example, 23 V. Although there are cases in the following description where numerical examples are recited in parentheses after each potential to help intuitive recognition, the potentials are not limited to these values.

The control circuit 15 causes the potentials of the source-side selection gates SGS of the selected block 14s, the drain-side selection gates SGD of the selected block 14s, and the source-side selection gates SGS of the unselected block 14u to increase to an intermediate potential VeraG by following the potential of the source line 29. The intermediate potential VeraG is, for example, a potential that is about 7 to 10 V lower than the erasing potential Vera (23 V), e.g., 13 to 16 V.

The control circuit 15 applies a word line-side erasing potential Vera_WL to the word lines WL of the selected block 14s. The word line-side erasing potential Vera_WL is a potential that is lower than the intermediate potential VeraG, e.g., 0.5 V.

Thereby, the erasing potential Vera (23 V) from the source line 29 is applied to the lower end of the unselected pillar 60u; and the intermediate potential VeraG (13 to 16 V) is applied to the source-side selection gates SGS surrounding the lower portion 60a of the unselected pillar 60u. Also, in the unselected pillar 60u, the donor concentration of the lower portion 60a is higher than the donor concentration of the central portion 60b. As a result, due to the potential difference and the donor concentration difference, GIDL (Gate-Induced Drain Leakage) occurs at the boundary vicinity between the lower portion 60a and the central portion 60b of the unselected pillar 60u; and holes (h) and electrons are generated. Of the holes and the electrons, the electrons are absorbed by the source line 29 which is positive; but the holes move toward the bit line 13. Thereby, the holes are supplied to the bit line 13 from the unselected pillar 60u; and the potential of the bit line 13 increases. As a result, the potential of the bit line 13 starts to increase from the ground potential.

When the potential differences between the potential of the unselected pillar 60u and the drain-side selection gates SGD of the unselected block 14u and between the potential of the unselected pillar 60u and the word lines WL of the unselected block 14u become a prescribed value, e.g., 7 V, the control circuit 15 sets the word lines WL and the drain-side selection gates SGD of the unselected block 14u to the floating state. As a result, the potentials of the word lines WL and the drain-side selection gates SGD of the unselected block 14u start to increase by following the potential of the unselected pillar 60u while maintaining the prescribed potential difference with the unselected pillar 60u. The potential of the bit line 13 ultimately reaches the erasing potential Vera (23 V).

The potential of the bit line 13 is applied to the upper end of the selected pillar 60s. The intermediate potential VeraG (13 to 16 V) is applied to the drain-side selection gates SGD surrounding the selected pillar 60s; and in the selected pillar 60s, the donor concentration of the upper portion 60c is higher than the donor concentration of the central portion 60b. Therefore, due to the potential difference and the donor concentration difference, a GIDL occurs at the boundary vicinity between the upper portion 60c and the central portion 60b of the selected pillar 60s; and holes and electrons are generated. The holes that are generated accumulate inside the selected pillar 60s.

On the other hand, the erasing potential Vera (23 V) from the source line 29 is applied to the lower end of the selected pillar 60s; and the intermediate potential VeraG (13 to 16 V) is applied to the source-side selection gates SGS surrounding the selected pillar 60s. Therefore, due to the potential difference, a GIDL occurs at the boundary vicinity between the lower portion 60a and the central portion 60b of the selected pillar 60s; and holes and electrons are generated. Of the holes and the electrons, the holes accumulate inside the selected pillar 60s.

Thus, the holes are supplied from the upper end side and the lower end side and accumulate inside the selected pillar 60s. Thereby, the potential of the selected pillar 60s becomes a potential that is near the erasing potential Vera (23 V). On the other hand, the word line-side erasing potential Vera_WL (0.5 V) is applied to the word lines WL surrounding the central portion 60b of the selected pillar 60s. As a result, for the memory cells MC of the selected block 14s, a high voltage is applied between the selected pillar 60s and the word lines WL; and the holes that have accumulated in the selected pillar 60s flow as a tunneling current through the tunneling insulating film 62 (referring to FIG. 4) toward the word lines WL and are injected into the charge storage film 63 (referring to FIG. 4). Pair annihilation of the electrons stored in the charge storage film 63 occurs due to the holes; the threshold voltages of the memory cells MC decrease; and the data is erased.

On the other hand, because the word lines WL surrounding the unselected pillar 60u are in the floating state, the high voltage is not applied to the charge storage film 63 surrounding the unselected pillar 60u regardless of the potential of the unselected pillar 60u. Therefore, the erase operation is not performed for the unselected block 14u.

Effects of the embodiment will now be described.

In the semiconductor memory device 1 according to the embodiment, at least a portion of the control circuit 15 is disposed between the silicon substrate 10 and the stacked body 30. Therefore, the integration of the semiconductor memory device 1 is high.

Also, in the embodiment, the source line 29 is formed of the metal film 26, the n$^+$-type silicon layer 27, and the n$^-$-type silicon layer 28. Therefore, the potential of the source line 29 with low resistance can be controlled by the control circuit 15 via the contacts/interconnect 44/50 and the contact/interconnect 46/52. As a result, faster operations can be realized even without using the silicon substrate 10 as a source line.

Also, in the embodiment, when erasing the data from the memory cells MC of the selected block 14s, the potential of the bit line 13 is caused to increase by setting the bit line 13 to the floating state and by subsequently causing the GIDL to occur in the unselected pillar 60u and by supplying the holes generated thereby to the bit line 13. As a result, a high potential can be applied to the selected pillar 60s from the two sides of the source line 29 and the bit line 13; and the holes can be supplied to the selected pillar 60s by causing the GIDL to occur at both the lower portion 60a and the upper portion 60c of the selected pillar 60s. As a result, the erase operation of the selected block 14s can be performed reliably without additionally providing a potential generation circuit for applying the erasing potential Vera to the bit line 13.

The intermediate potential VeraG that is applied to the source-side selection gates SGS of the selected block 14s, the drain-side selection gates SGD of the selected block 14s, and the source-side selection gates SGS of the unselected block 14u may be the same or mutually-different between the gates. However, the intermediate potential VeraG is set to be a potential that is lower than the erasing potential Vera so that the GIDL occurs due to the relationship with the erasing potential Vera.

(Modification of First Embodiment)

A modification of the first embodiment will now be described.

Figure 6:
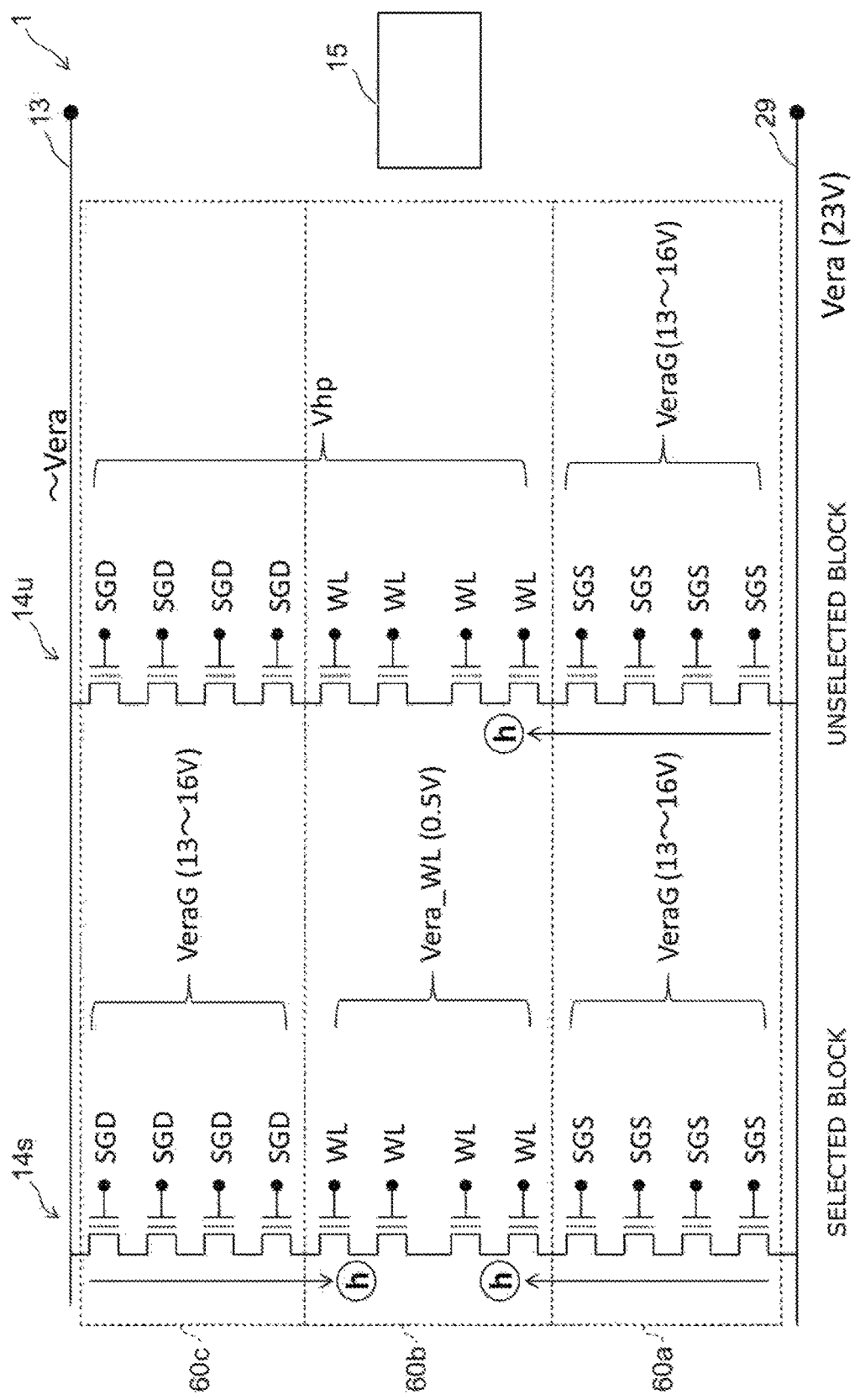
FIG. 6 is a circuit diagram showing the method for erasing the data of a semiconductor memory device according to a modification.

FIG. 6 is a circuit diagram showing the method for erasing the data of the semiconductor memory device according to the modification.

Although an example is shown in the first embodiment described above in which the word lines WL and the drain-side selection gates SGD of the unselected block 14u are set to the floating state, in the modification as shown in FIG. 6, the control circuit 15 applies a potential to the word lines WL and the drain-side selection gates SGD of the unselected block 14u so that the potential follows the potential change of the source line 29. Thereby, the potentials of the word lines WL and the drain-side selection gates SGD of the unselected block 14u are caused to increase from the ground potential to a hole pass potential Vhp. The hole pass potential Vhp is a potential that is higher than the word line-side erasing potential Vera_WL but not more than the intermediate potential VeraG, and is a potential such that the holes are not injected from the unselected pillar 60u into the charge storage film 63 even if the potential of the unselected pillar 60u increases to the erasing potential Vera. The hole pass potential Vhp is set to be, for example, a potential that is about 7 to 9 V lower than the erasing potential Vera.

In the modification, by causing the potentials of the word lines WL and the drain-side selection gates SGD of the unselected block 14u to increase by following the potential of the source line 29 and by setting the hole pass potential Vhp ultimately reached to be the intermediate potential VeraG or less, a potential barrier for the holes is not formed inside the unselected pillar 60u; and the holes can pass through the unselected pillar 60u and can reach the bit line 13. On the other hand, by setting the hole pass potential Vhp to be a prescribed potential that is higher than the word line-side erasing potential Vera_WL, the injection of the holes from the unselected pillar 60u into the charge storage film 63 can be avoided; and the erasing of the data in the unselected block 14u can be prevented.

The potentials of the word lines WL and the drain-side selection gates SGD of the unselected block 14u may have a gradient along the Z-direction. For example, the potential inside the unselected pillar 60u can have a gradient by setting the potentials of the word lines WL to be higher than those of the drain-side selection gates SGD; and a force toward the bit line 13 can be additionally applied to the holes. As a result, the movement of the holes inside the unselected pillar 60u is promoted; and the erasing speed increases.

Otherwise, the configuration, the operations, and the effects of the modification are similar to those of the first embodiment described above.

Second Embodiment

A second embodiment will now be described.

FIG. 7A and FIG. 7B are mutually-orthogonal cross-sectional views showing a semiconductor memory device according to the embodiment.

As shown in FIG. 7A and FIG. 7B, the semiconductor memory device 2 according to the embodiment differs from the semiconductor memory device 1 according to the first embodiment described above (referring to FIG. 3A and FIG. 3B) in that n$^-$-type silicon members 71 are provided between the n$^-$-type silicon layer 28 and the silicon pillars 60. The silicon pillars 60 are connected to the n$^-$-type silicon layer 28 via the silicon members 71. The silicon members 71 are made by selective CVD growth using the n$^-$-type silicon layer 28 as a starting point. Accordingly, the silicon members 71 contact the n$^-$-type silicon layer 28.

According to the embodiment, the resistance between the n$^-$-type silicon layer 28 and the silicon pillars 60 can be reduced.

Otherwise, the configuration, the operations, and the effects of the embodiment are similar to those of the first embodiment described above.

Third Embodiment

A third embodiment will now be described.

Figures 8A, 8B:
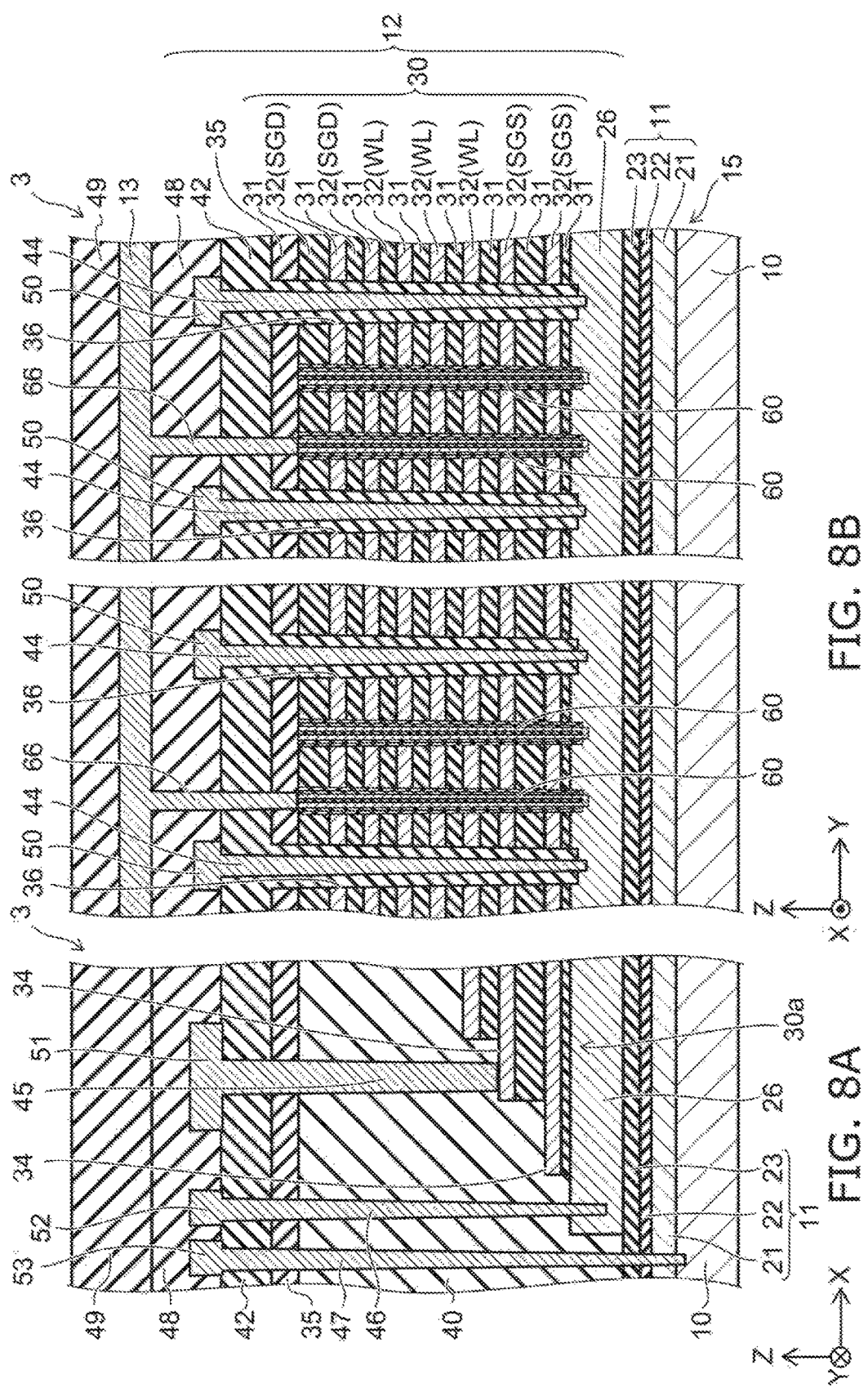
FIG. 8A and FIG. 8B are mutually-orthogonal cross-sectional views showing the semiconductor memory device according to the embodiment.

FIG. 8A and FIG. 8B are mutually-orthogonal cross-sectional views showing a semiconductor memory device according to the embodiment.

As shown in FIG. 8A and FIG. 8B, the semiconductor memory device 3 according to the embodiment differs from the semiconductor memory device 1 according to the first embodiment described above (referring to FIG. 3A and FIG. 3B) in that the n$^+$-type silicon layer 27 and the n$^-$-type silicon layer 28 are not provided. In the semiconductor memory device 3, the lower ends of the silicon pillars 60 and the lower ends of the contacts 44 contact the metal film 26.

In the embodiment as well, the donor concentrations of the lower portion 60a and the upper portion 60c of the silicon pillar 60 are higher than the donor concentration of the central portion 60b. For example, such a configuration can be formed by forming the lower portion of the stacked body 30, forming the lower portion 60a of the silicon pillar 60 inside the lower portion of the stacked body 30, subsequently performing ion implantation of an impurity that forms donors into the lower portion 60a, subsequently forming the central portion and the upper portion of the stacked body 30, forming the central portion 60b and the upper portion 60c of the silicon pillar 60 inside the central portion and the upper portion of the stacked body 30, and again performing ion implantation of an impurity that forms donors.

According to the embodiment, the resistance of the source line can be reduced even further.

Otherwise, the configuration, the operations, and the effects of the embodiment are similar to those of the first embodiment described above.

Fourth Embodiment

A fourth embodiment will now be described.

Figure 9:
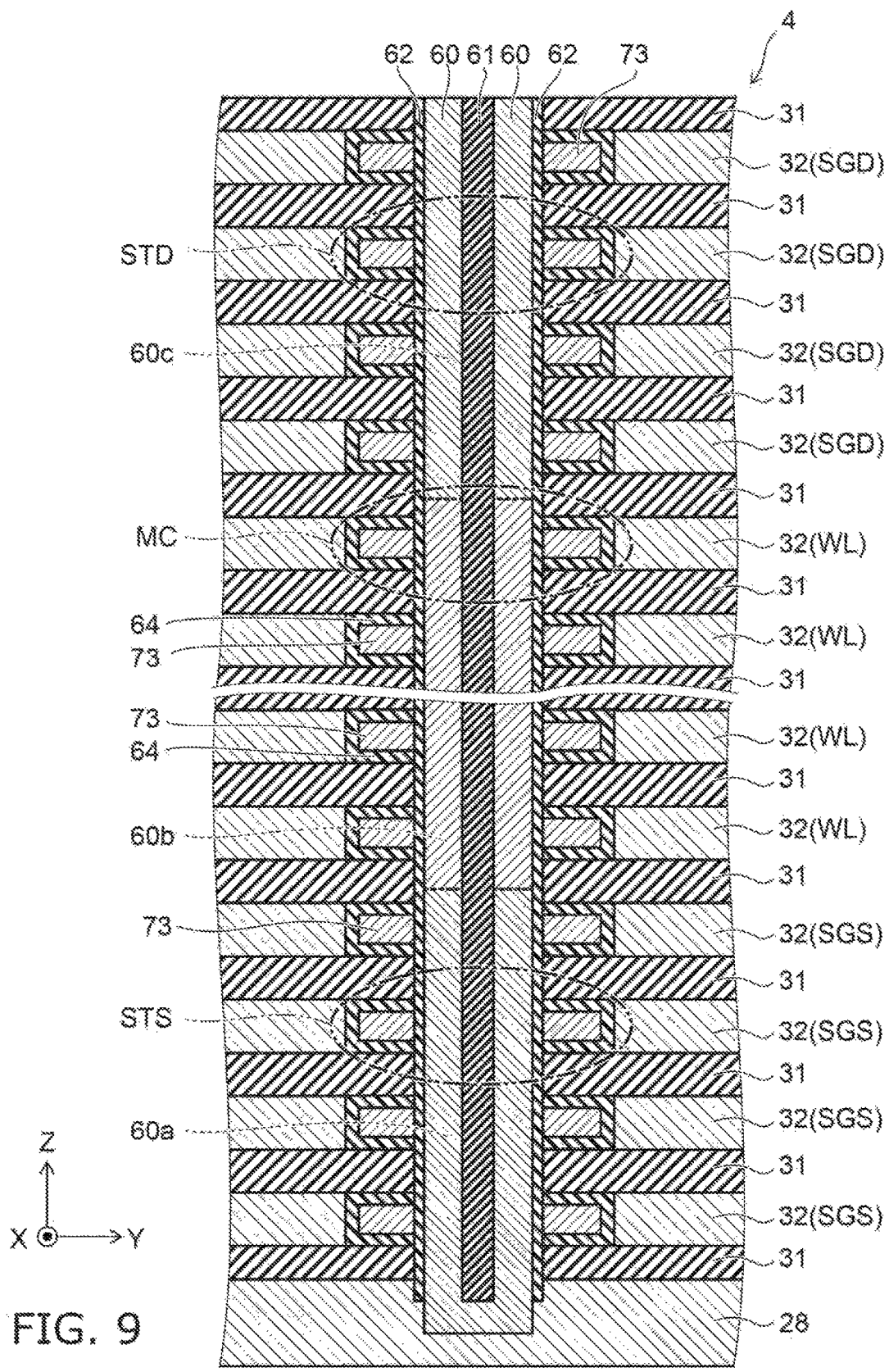
FIG. 9 is a cross-sectional view showing one silicon pillar periphery of the embodiment.

FIG. 9 is a cross-sectional view showing one silicon pillar periphery of the embodiment.

As shown in FIG. 9, the semiconductor memory device 4 according to the embodiment differs from the semiconductor memory device 1 according to the first embodiment described above (referring to FIG. 4) in that a floating gate electrode 73 is provided instead of the charge storage film 63. The floating gate electrode 73 is formed of a conductive material and is formed of, for example, silicon. Also, the floating gate electrode 73 is divided at each crossing portion between the silicon pillar 60 and the electrode films 32. In other words, one floating gate electrode 73 belongs to one memory cell MC. Also, the blocking insulating film 64 is provided to cover the upper surface of the floating gate electrode 73, the lower surface of the floating gate electrode 73, and the side surface of the floating gate electrode 73 on the electrode film 32 side.

According to the embodiment, by using the floating gate electrode 73 made of the conductive material as the charge storage member, the electrons can be stored in the charge storage member at a higher density. As a result, even higher integration of the semiconductor memory device is possible. Also, by dividing the floating gate electrode 73 every memory cell MC, the movement of the electrons between the memory cells MC can be suppressed even in the case where the integration of the memory cells MC is increased; and degradation of the data retention characteristics can be suppressed.

Otherwise, the configuration, the operations, and the effects of the embodiment are similar to those of the first embodiment described above.

Although an example is shown in the embodiments described above in which the silicon pillar 60 pierces the electrode films 32, this is not limited thereto. It is sufficient for the electrode film 32 to be disposed at a position so that the conductivity of one portion of the silicon pillar 60 is changed by being affected by the potential of the electrode film 32. For example, the electrode film 32 extending in the X-direction and the silicon pillar 60 extending in the Z-direction may be skew to each other.

Further, in the embodiments described above, one of the contacts/Interconnect 44/50 and the contact/interconnect 46/52 may not be provided insofar as the potential of the source line 29 can be wholly controlled via the other of the contacts/interconnect 44/50 and the contact/interconnect 46/52.

According to the embodiments described above, a semiconductor memory device and a method for driving the semiconductor memory device can be realized in which the integration is high and the operations are stable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Additionally, the embodiments described above can be combined mutually.

What is claimed is:

1. A semiconductor memory device, comprising:
a first electrode;
a second electrode;
a third electrode;
a fourth electrode;
a first semiconductor member including a first portion and a second portion, the first portion being affected by a potential of the first electrode, the second portion being affected by a potential of the second electrode;
a second semiconductor member including a third portion and a fourth portion, the third portion being affected by a potential of the third electrode, the fourth portion being affected by a potential of the fourth electrode;
a first charge storage member provided between the first semiconductor member and the first electrode;
a first interconnect connected to a first end on the second electrode side of the first semiconductor member and to a first end on the fourth electrode side of the second semiconductor member; and
a control circuit, the control circuit in a first operation setting the first interconnect to a floating state, causing a potential of a second end on the third electrode side of the second semiconductor member to increase to a first potential, causing the potential of the third electrode to increase to a second potential by following the first potential, causing the potential of the second electrode to increase to a third potential by following the first potential, applying a fourth potential to the first electrode, and setting the fourth electrode to a floating state or causing the potential of the fourth electrode to increase to a fifth potential, the second potential being lower than the first potential, the third potential being lower than the first potential, the fourth potential being lower than the second potential and the third potential, the fifth potential being higher than the fourth potential but not more than the second potential,
wherein electrons stored in the first charge storage member are reduced by the first operation.

2. The semiconductor memory device according to claim 1, further comprising a fifth electrode,
the first semiconductor member further including a fifth portion affected by a potential of the fifth electrode, the first portion being disposed between the second portion and the fifth portion along the first semiconductor member,
the control circuit in the first operation causing a potential of a second end on the fifth electrode side of the first semiconductor member to increase to the first potential, and causing the potential of the fifth electrode to increase to a sixth potential by following the first potential, the sixth potential being lower than the first potential.

3. The semiconductor memory device according to claim 2, wherein the second potential, the third potential, and the sixth potential are equal to each other.

4. The semiconductor memory device according to claim 2, wherein
a donor concentration of the fifth portion and a donor concentration of the second portion are higher than a donor concentration of the first portion, and
a donor concentration of the third portion is higher than a donor concentration of the fourth portion.

5. The semiconductor memory device according to claim 1, wherein a potential of the first interconnect increases in the first operation.

6. The semiconductor memory device according to claim 1, wherein the first operation includes holes being supplied from the second semiconductor member to the first interconnect, and holes being supplied from the first interconnect to the first semiconductor member.

7. The semiconductor memory device according to claim 1, further comprising a second charge storage member provided between the second semiconductor member and the fourth electrode, the fifth potential being a potential at which holes substantially are not injected from the second semiconductor member into the second charge storage member.

8. The semiconductor memory device according to claim 1, further comprising a conductive film, the conductive film being connected to a second end on the first electrode side of the first semiconductor member and the second end of the second semiconductor member,
the control circuit causing a potential of the conductive film to increase to the first potential in the first operation.

9. The semiconductor memory device according to claim 8, wherein
the conductive film includes a semiconductor layer of an n-type, and
the first semiconductor member and the second semiconductor member contact the semiconductor layer.

10. The semiconductor memory device according to claim 8, further comprising:
a third semiconductor member provided between the conductive film and the first semiconductor member; and
a fourth semiconductor member provided between the conductive film and the second semiconductor member,
the conductive film including a semiconductor layer of an n-type,
the third semiconductor member and the fourth semiconductor member contacting the semiconductor layer.

11. The semiconductor memory device according to claim 8, wherein
the conductive film includes a metal layer, and
the first semiconductor member and the second semiconductor member contact the metal layer.

12. The semiconductor memory device according to claim 8, further comprising:
a second interconnect provided to be parallel to the first interconnect; and
a third semiconductor member including a sixth portion and a seventh portion, the sixth portion being affected by the potential of the first electrode, the seventh portion being affected by the potential of the second electrode, a first end of the third semiconductor member being connected to the second interconnect, a second end of the third semiconductor member being connected to the conductive film.

13. The semiconductor memory device according to claim 8, further comprising:
a substrate; and
an insulating film provided above the substrate,
the conductive film being disposed above the insulating film.

14. The semiconductor memory device according to claim 13, wherein at least a portion of the control circuit is disposed inside the substrate and inside the insulating film.

15. The semiconductor memory device according to claim 1, wherein
the first electrode, the second electrode, the third electrode, and the fourth electrode extend in a first direction,
the first interconnect extends in a second direction crossing the first direction, and
the first semiconductor member and the second semiconductor member extend in a third direction, the third direction crossing a plane including the first direction and the second direction.

16. A semiconductor memory device, comprising:
a substrate;
an insulating film provided above the substrate;
a semiconductor layer provided above the insulating film, a conductivity type of the semiconductor layer being an n-type;
a first electrode provided in a first region above the semiconductor layer;
a second electrode provided above the first electrode;
a third electrode provided above the second electrode;
a fourth electrode provided in a second region above the semiconductor layer;
a fifth electrode provided above the fourth electrode;
a sixth electrode provided above the fifth electrode;
a first semiconductor member piercing the first electrode, the second electrode, and the third electrode, a lower end of the first semiconductor member being connected to the semiconductor layer;
a second semiconductor member piercing the fourth electrode, the fifth electrode, and the sixth electrode, a lower end of the second semiconductor member being connected to the semiconductor layer,
a first charge storage member provided between the first semiconductor member and the second electrode;
a second charge storage member provided between the second semiconductor member and the fifth electrode:
a first interconnect connected to an upper end of the first semiconductor member and an upper end of the second semiconductor member; and
a control circuit, the control circuit in a first operation setting the first interconnect to a floating state, causing a potential of the semiconductor layer to increase to a first potential, causing potentials of the first electrode, the third electrode, and the fourth electrode to increase to a second potential lower than the first potential by following the first potential, applying a potential lower than the second potential to the second electrode, and setting the fifth electrode and the sixth electrode to a floating state.

17. A method for driving a semiconductor memory device, the semiconductor memory device including a first electrode, a second electrode, a third electrode, a fourth electrode, a first semiconductor member, a second semiconductor member, a first charge storage member, and a first interconnect, the first charge storage member being provided between the first semiconductor member and the first electrode, the first interconnect being connected to a first end on the second electrode side of the first semiconductor member and to a first end on the fourth electrode side of the second semiconductor member, the first semiconductor member including a first portion and a second portion, the first portion being affected by a potential of the first electrode, the second portion being affected by a potential of the second electrode, the second semiconductor member including a third portion and a fourth portion, the third portion being affected by a potential of the third electrode, the fourth portion being affected by a potential of the fourth electrode,
the method for driving the semiconductor memory device comprising a process of erasing data of a memory cell by setting the first interconnect to a floating state, causing a potential of a second end on the third electrode side of the second semiconductor member to increase to a first potential, causing the potential of the third electrode to increase to a second potential by following the first potential, causing the potential of the second electrode to increase to a third potential by following the first potential, applying a fourth potential to the first electrode, and setting the fourth electrode to a floating state or causing the potential of the fourth electrode to increase to a fifth potential, the second potential being lower than the first potential, the third potential being lower than the first potential, the fourth potential being lower than the second potential and the third potential, the fifth potential being higher than the fourth potential but not more than the second potential, the memory cell being formed at a crossing portion between the first semiconductor member and the first electrode.

18. The method for driving the semiconductor memory device according to claim 17, wherein
the semiconductor memory device further includes a fifth electrode,
the first semiconductor member further includes a fifth portion affected by a potential of the fifth electrode, the first portion being disposed between the second portion and the fifth portion along the first semiconductor member, and
the process includes causing a potential of a second end on the fifth electrode side of the first semiconductor member to increase to the first potential, and causing the potential of the fifth electrode to increase to a sixth potential by following the first potential, the sixth potential being lower than the first potential.

19. The method for driving the semiconductor memory device according to claim 17, wherein the potential of the first interconnect increases in the process.

* * * * *